(12) United States Patent
Fujino

(10) Patent No.: US 9,142,493 B2
(45) Date of Patent: Sep. 22, 2015

(54) SEMICONDUCTOR DEVICE

(71) Applicant: Junji Fujino, Chiyoda-ku (JP)

(72) Inventor: Junji Fujino, Chiyoda-ku (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 14/356,488

(22) PCT Filed: Jan. 10, 2013

(86) PCT No.: PCT/JP2013/050288
§ 371 (c)(1),
(2) Date: May 6, 2014

(87) PCT Pub. No.: WO2013/108706
PCT Pub. Date: Jul. 25, 2013

(65) Prior Publication Data
US 2014/0367701 A1    Dec. 18, 2014

(30) Foreign Application Priority Data

Jan. 18, 2012   (JP) .................. 2012-007703

(51) Int. Cl.
*H01L 23/495*   (2006.01)
*H01L 23/00*    (2006.01)
*H01L 21/52*    (2006.01)

(52) U.S. Cl.
CPC .......... *H01L 23/49513* (2013.01); *H01L 21/52* (2013.01); *H01L 24/27* (2013.01); *H01L 24/29* (2013.01); *H01L 24/32* (2013.01); *H01L 24/83* (2013.01); *H01L 2224/2784* (2013.01);

(Continued)

(58) Field of Classification Search
CPC ... H01L 23/49513; H01L 24/27; H01L 24/83; H01L 2224/83048; H01L 2224/83801
See application file for complete search history.

(56) References Cited

U.S. PATENT DOCUMENTS

2010/0148367 A1*  6/2010  Matsuo et al. ................ 257/751
2011/0272792 A1* 11/2011  Gruenhagen et al. ......... 257/666
2014/0138833 A1*  5/2014  Seng et al. .................... 257/751

FOREIGN PATENT DOCUMENTS

JP    3-019247 A    1/1991
JP    7-297329 A   11/1995

(Continued)

OTHER PUBLICATIONS

International Search Report (PCT/ISA/210) mailed on Apr. 9, 2013, by the Japanese Patent Office as the International Searching Authority for International Application No. PCT/JP2013/050288.

(Continued)

*Primary Examiner* — Peniel M Gumedzoe
(74) *Attorney, Agent, or Firm* — Buchanan Ingersoll & Rooney PC

(57) ABSTRACT

The semiconductor device includes; a semiconductor element in which a metallization layer is formed on the backside side; a metallic lead frame that is arranged in parallel, with a distance spaced apart from the semiconductor element; a first bonding layer that is provided between the semiconductor element and the lead frame, and is bonded to the metallization layer; and a second bonding layer that is provided between the semiconductor element and the lead frame, and bonds the first bonding layer to the lead frame. The first bonding layer is expanded at a central portion toward the lead frame.

5 Claims, 4 Drawing Sheets

(52) U.S. Cl.
CPC . *H01L2224/27332* (2013.01); *H01L 2224/291* (2013.01); *H01L 2224/29019* (2013.01); *H01L 2224/29076* (2013.01); *H01L 2224/29078* (2013.01); *H01L 2224/29111* (2013.01); *H01L 2224/3207* (2013.01); *H01L 2224/32245* (2013.01); *H01L 2224/45144* (2013.01); *H01L 2224/48137* (2013.01); *H01L 2224/48139* (2013.01); *H01L 2224/48247* (2013.01); *H01L 2224/73265* (2013.01); *H01L 2224/83048* (2013.01); *H01L 2224/83193* (2013.01); *H01L 2224/83385* (2013.01); *H01L 2224/83801* (2013.01); *H01L 2224/83825* (2013.01); *H01L 2224/92247* (2013.01); *H01L 2924/10253* (2013.01); *H01L 2924/351* (2013.01)

(56) References Cited

FOREIGN PATENT DOCUMENTS

| | | |
|---|---|---|
| JP | 2002-158238 A | 5/2002 |
| JP | 2003-068930 A | 3/2003 |
| JP | 2006-114649 A | 4/2006 |

OTHER PUBLICATIONS

Office Action (Notification of Reasons for Refusal) issued on Sep. 2, 2014, by the Japan Patent Office in corresponding Japanese Patent Application No. 2013-554280, and an English Translation of the Office Action. (6 pages).

* cited by examiner

SEMICONDUCTOR DEVICE

TECHNICAL FIELD

The present invention relates to semiconductor devices characterized by die bonding.

BACKGROUND ART

Power modules have been used in all scenes from power generation and power transmission to effective use and regeneration of energy. In manufacturing such a semiconductor device, first, a silicon wafer formed with circuits is finely cut to form silicon (Si) chips (integrated circuit (IC) chips). This cut state is referred to as dice. The die is fixed at a predetermined position of a lead frame. This process is referred to as die bonding.

In semiconductor elements including power modules, miniaturization has been being advanced. In proportion as heat generation density increases, the quality of a die bonding portion (the presence or absence of a void and/or an unbonded portion) gives a large influence on heat dissipation properties. Hereafter, it is conceivable that a reduction in thickness of the IC chip will be advanced for higher efficiency. Diffusion of heat by the semiconductor element itself is difficult; and thus, it is conceivable that the quality of the die bonding portion gives a remarkable influence by the heat dissipation properties.

In order to suppress the occurrence of the void and/or the unbonded portion in the die bonding, an expensive system such as a vacuum soldering system is used. A process such as performing scrub, which is large in the number of processes, is also used; however, the occurrence of the void is not basically solved. In a high-performance silicon carbide (SiC) semiconductor, securement of the heat dissipation properties at the die bonding portion will be more important than ever before due to becoming high in operating temperature.

Patent Document 1 proposes a method in which the bottom of a heat sink is processed into a pyramid shape to facilitate the escape of a void during soldering. Machining of the backside (die bonding surface) is difficult to perform with respect to a fragile Si chip with a thickness of 100 µm, and processing strain gives an influence on reliability even when the machining can be performed.

Patent Document 2 proposes a method in which solder is once pressed to expand to 50 to 90% of a bonding area and then the solder is made to melt to perform die bonding. As long as the total amount of solder material serving as bonding material is melted like the method disclosed in this document, the occurrence of a large void is unavoidable even when scrub is performed.

Patent Document 3 proposes a method in which pads divided by slits are formed on a bonding surface and high temperature solder is supplied thereto respectively. A slit portion is completely an unbonded portion. In the case where heat generation is large and diffusion of the heat cannot be expected due to a reduction in thickness of a chip, the slit portion causes thermal damage.

PRIOR ART DOCUMENT

Patent Document

Patent Document 1: Japanese Unexamined Patent Publication No. H07-297329
Patent Document 2: Japanese Unexamined Patent Publication No. 2006-114649
Patent Document 3: Japanese Unexamined Patent Publication No. 2003-068930

SUMMARY OF THE INVENTION

Problems to be Solved by the Invention

The power modules have become popular in all products from transportation and industrial equipment to home appliances and information terminals. More particularly, the power modules mounted on home appliances such as an air conditioner are required to achieve not only long-term reliability but also miniaturization and higher efficiency. The SiC semiconductors are expected to be the mainstream of future power modules in a point, which is high in operating temperature and superior in efficiency. Thus, the development of package configurations that are also applicable to the SiC semiconductors is required.

The present invention has been made to solve these problems, and an object of the present invention is to increase reliability of a die bonding portion in a semiconductor device including a power module.

Means for Solving the Problems

According to the present application, there is provided a semiconductor device including: a semiconductor element in which a metallization layer is formed on the backside side; a metallic lead frame that is arranged in parallel, with a distance spaced apart from the semiconductor element; a first bonding layer that is provided between the semiconductor element and the lead frame, and is bonded to the metallization layer; and a second bonding layer that is provided between the semiconductor element and the lead frame, and bonds the first bonding layer to the lead frame. The first bonding layer is expanded at a central portion toward the lead frame.

Advantageous Effect of the Invention

By a convex portion formed in the bonding portion, the nearer to an outer edge a die bonding portion is, the larger the thickness is, whereby a void generated in bonding material is positively eliminated to the outside. As a result, reliability of die bonding is increased.

MODE FOR CARRYING OUT THE INVENTION

Embodiment 1

Figure 1:
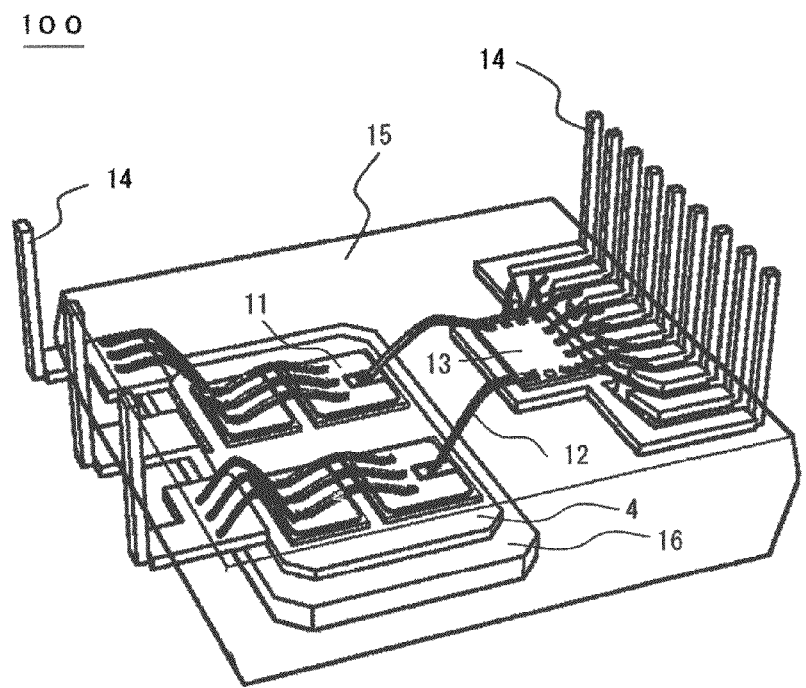
FIG. 1 is a schematic configuration view showing a semiconductor device according to the present invention.

The whole configuration of a semiconductor device 100 referred to as transfer power mold (T-PM) is shown in FIG. 1. The semiconductor device 100 includes: a lead frame 4; a power element 11; a bonding wire 12; a control element 13; an external lead 14; a molding resin 15; a heat sink 16; and the like. The lead frame 4, the power elements 11, the bonding wires 12, the control element 13, the heat sink 16 are resin-sealed with a molding resin 15. The lead frame after completion of bonding is set in a metal mold and thermosetting resin is poured to form the package type semiconductor device 100.

The process of die bonding, by which a semiconductor element such as the power element 11 is bonded to the lead frame 4, will be described by using FIG. 2 to FIG. 11. The power element 11 and the control element 13 may be formed by a wide band gap semiconductor that is larger in band gap than silicon (Si), in addition to by a semiconductor formed by silicon. As the wide band gap semiconductor, there exist, for example, silicon carbide (SiC), gallium nitride-based material, and diamond. In the case of using the wide band gap semiconductor, permissible current density is high and power loss is also low; and therefore, miniaturization of a device using a power semiconductor element can be achieved.

Figure 2:
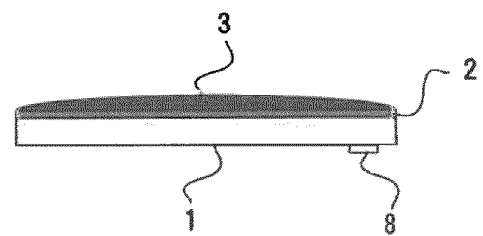
FIG. 2 is a conceptual view showing an initial process of a die bonding process according to Embodiment 1.
Figure 3:
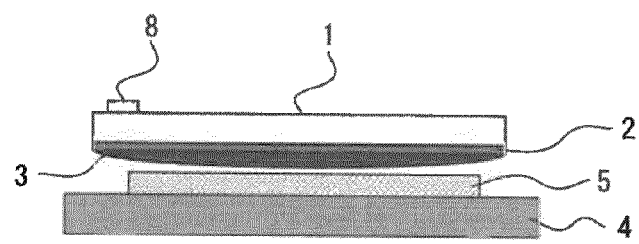
FIG. 3 is a conceptual view showing a subsequent process of the die bonding process according to Embodiment 1.
Figure 4:
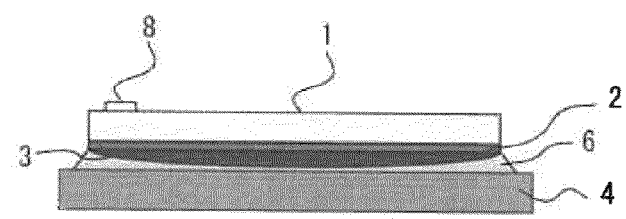
FIG. 4 is a conceptual view showing a finished product of the die bonding process according to Embodiment 1.

FIG. 2 to FIG. 4 are conceptual views each showing the die bonding process of the semiconductor element according to Embodiment 1. In FIG. 2, a chip of a size of 6 mm×6 mm is used for an Si chip 1. A metallization layer 2 is formed on the backside of the Si chip 1 with a thickness of 0.2 mm and a wire bonding electrode 8 is formed on the surface thereof. The composition of the metallization layer 2 is aluminum (Al), nickel (Ni), and gold (Au). Solder paste of high temperature solder (melting point: 240° C.) serving as bonding material is printed and supplied on the surface of the metallization layer 2 by using a printing mask (opening portion: 5 mm×5 mm, thickness: 0.3 mm), with the surface of the Si chip 1 facing downward; and the solder paste is made to melt by a hot plate heated to 260° C. The solder paste is one in which solder powder and flux are kneaded. As a result, a convex bonding layer 3 is formed on the backside of the Si chip 1. The composition of the convex bonding layer 3 is 95% tin (Sn) and 5% antimony (Sb). The convex bonding layer 3 has a gradual convex shape with a thickness of approximately 0.2 mm at a central portion.

Next, as shown in FIG. 3, the metallic lead frame 4 is prepared. In this case, a copper (Cu) plate having a size of 10 mm×10 mm with a thickness of 0.6 mm is used for the lead frame 4. Solder paste 5 of low temperature solder (melting point: 217° C.) serving as bonding material is printed and supplied on the lead frame 4 by using the printing mask (opening portion: 5 mm×5 mm, thickness: 0.3 mm); and then, the Si chip 1 is mounted on the lead frame 4, with the convex bonding layer 3 facing downward. Solder paste with a particle diameter of 15 to 25 μm and a flux content of 10 wt % is used for the solder paste 5. The composition of the low temperature solder is 96.5% Sn, 3% silver (Ag), and 0.5%.

Finally, the solder paste 5 of the low temperature solder is made to melt by the hot plate heated to 240° C. to form a concave bonding layer 6 (see FIG. 4). Even when the low temperature solder is in a melted state, the convex bonding layer 3 maintains a solid state. More specifically, the solidus temperature of the convex bonding layer 3 is higher than solidus temperature of the concave bonding layer 6. The Si chip 1 is bonded to the lead frame 4 by this process. After that, the lead frame 4 is mounted on the heat sink 16; and the wire bonding electrode 8 of the Si chip 1 is connected to the external lead 14 and the like by a gold wire. The Si chip 1 in which wire bonding is performed is mold-formed with the molding resin 15.

An evaporation component in the flux of the solder paste 5 is gasified to become an air bubble during the heating. Liquid (melted solder) that is present in the concave bonding layer 6 increases as the thickness of the concave bonding layer 6 is nearer to an outer edge; and therefore, the air bubble is positively eliminated to the outside. This is because that the air bubble in the liquid tries to be a state where a surface area becomes as small as possible due to surface tension. If the air bubble is the same volume, the air bubble changes to a state where the shape thereof becomes spherical as nearly as possible; and as a result, driving force, which moves to an outer edge portion where the thickness of the liquid is large, is acted on the air bubble. Even if the air bubble (void) remains in the concave bonding layer 6, the void is almost a spherical void 71 (see FIG. 5) formed near the outer edge portion. The spherical void 71 is sufficiently smaller in diameter than the thickness of the concave bonding layer 6; and therefore, an influence on heat dissipation properties is minute as compared to a columnar void that is almost the same height as the thickness of a bonding portion.

Figure 5:
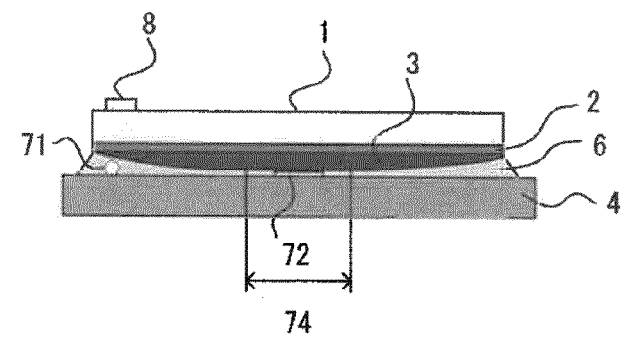
FIG. 5 is a conceptual view showing a void generated in a die bonding portion.

The convex bonding layer 3 shown in FIG. 5 has a flat portion 74 with a diameter of 0.8 mm in the center. The flat portion 74 is formed by performing press working on an apex portion of the convex bonding layer 3. The central portion of the convex bonding layer 3 is flattened into a circular form; and thus, a gradient during a mounting of the semiconductor element can be suppressed. If the gradient is generated during the bonding, there is a concern that, for example, there exists the occurrence of a crack due to thermal stress at a portion where the height of the bonding portion is small; however, the occurrence of this crack is suppressed.

As shown in FIG. 5, it is assumed that there remains a flat void 72 near the apex of the convex bonding layer 3. The flat void 72 is distantly separated not only by the thickness (0.2 mm) of the chip itself but also by the thickness (0.2 mm) of the convex bonding layer 3 from the outermost surface where the heat generation of the Si chip 1 is the largest. The heat generation can be expected to be sufficiently expanded before reaching there; and therefore, it is conceivable that the influence of the void 72 is small. It can be expected that the thinner the chip thickness is, the larger the effect is.

Even when the convex of the convex bonding layer 3 is in a spherical shape at only near the center and the outer edge portion is a flat and low portion, similar effects can be obtained if a large void can be eliminated from a center portion whose temperature becomes the highest. Furthermore, if a convex portion is formed by machining on the lead frame side on which the Si chip is mounted and a gradient can be made on the bonding portion together with the convex portion of the Si chip, a further effect is obtained.

If the size of the flat portion 74 is equal to or higher than 5% of the whole bonding area, the gradient can be suppressed. If the size of the flat portion is equal to or higher than 50% of the whole bonding area, driving force that eliminates a void to the outside is difficult to obtain. Even when a void whose area is the same as the flat portion is generated, if the heat is spread at 45 degrees and if the void is less than or equal to a diameter of 0.8 mm that is double of 0.4 mm, which is summed up by the thickness (0.2 mm) of the Si chip and the thickness (0.2 mm) of the convex bonding layer 3, thermal influence can be almost negligible and thus the dimension of the flat portion is recommended to be less than or equal to this diameter.

According to the present application, the high temperature solder is used, whereby the formation of the convex portion is facilitated by surface tension due to melted metal. The melting point is higher than that of metal to be used for bonding, whereby a state, in which the nearer to the outer edge the die bonding portion is, the thicker the thickness thereof is, is facilitated to secure during the heating time for bonding. In the case of previously supplying the high temperature solder, the solder is melted in an opened state; and therefore, a void with a diameter exceeding the thickness thereof is not generated in principle. The high temperature solder is not melted during the bonding and a void generated in the melted low temperature solder is eliminated toward the outer edge portion where a gap is wide.

Incidentally, the solder paste of the high temperature solder is used in this case; however, even when solder or metal of desired composition is supplied by plating, evaporation, dipping by immersion, or the like, similar effects can be obtained. Furthermore, after supplying metal, for example, remelting is made to be a convex state; and thus, similar effects can be obtained. In this case, the SnSb solder serving as the high temperature solder and the SnAgCu solder serving as the low temperature solder are used. However, as long as solder with different melting points are combined, similar effects can be obtained even when using the compositions of: Sn, Ag, and Cu (melting point: 217° C.); Sn and bismuth (Bi) (melting point: 140° C.), Au and Sn (melting point: 280° C.); Sn and Sb (melting point: 240° C.), and the like.

Bonding material made of low melting point metal powder in which high melting point metal powder is dispersed, for example, A-FAP of Asahi Kasei E-Materials Co., can be used. If this bonding material is once heated and aggregated, remelting is not made even when heated to the same temperature; and therefore, similar effects can be obtained even when the bonding material to be used for forming the convex portion is the same as the bonding material to be used for bonding. Bonding material with higher ratio of the high melting point metal powder is used as the high temperature solder; and as the low temperature solder, bonding material with the same or lower ratio of the high melting point metal powder or bonding material without containing the high melting point metal is used; and thus, similar effects can be obtained. Bonding material, in which the high melting point metal powder and the low melting point metal powder are dispersed, is bonding material in which cohesive force is low due to small liquid components and the occurrence of a void is unavoidable in a closed bonding portion. According to Embodiment 1, the convex is formed in the opened state; and therefore, even when the bonding material, which is made of the low melting point metal powder in which the high melting point metal powder is dispersed, is used, the occurrence of a large void is practically nought. Bonding is made by using bonding material which contains a relatively small void and small high melting point metal powder; and thus, the formation of a void with a thickness comparable to the thickness of the bonding portion is suppressed and heat dissipation properties can be secured.

Embodiment 2

Figure 6:
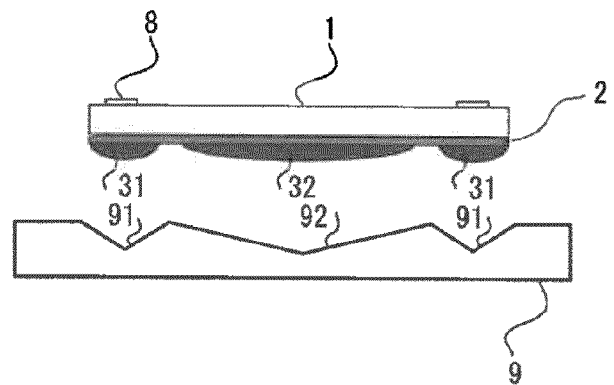
FIG. 6 is a conceptual view showing an initial process of a die bonding process according to Embodiment 2.
Figure 7:
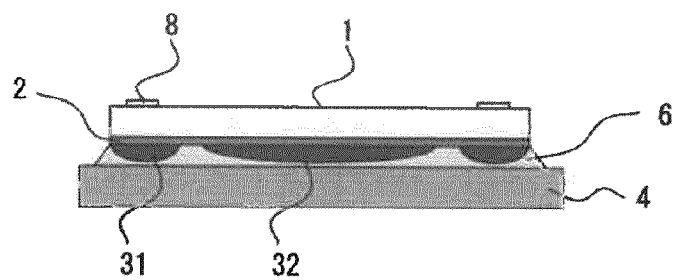
FIG. 7 is a conceptual view showing a finished product of the die bonding process according to Embodiment 2.

FIG. 6 and FIG. 7 are conceptual views each showing a die bonding process of a semiconductor element according to Embodiment 2. In Embodiment 2, as shown in FIG. 6, an aluminum jig 9 is used, the aluminum jig having opening portions 91 and an opening portion 92, each being shaped in a quadrangular pyramid. Solder paste of high temperature solder is filled in the opening portions 91, 92; and an Si chip 1 is mounted on the aluminum jig 9, with a metallization layer 2 facing downward. The solder paste of the high temperature solder filled in the opening portions 91, 92 is made to melt to transfer the high temperature solder on the metallization layer 2. Next, solder paste of low temperature solder is printed and supplied on a lead frame 4 by using a printing mask (opening portion; 5 mm×5 nm, thickness: 0.3 mm); and the Si chip 1 is mounted on the lead frame 4, with convex bonding layers 31, 32 facing downward.

Finally, solder paste 5 of the low temperature solder is made to melt by a hot plate heated to 240° C. to form a concave bonding layer 6 (see FIG. 7). The convex bonding layer 31 with a smaller convex shape than the convex bonding layer 32 with a central larger convex shape is formed on the backside of the Si chip 1 corresponding to a wire bonding electrode 8. The convex bonding layer 31 suppresses a void from being locally generated just beneath the wire bonding electrode.

If the void is present in a wire bonding portion, there is a concern that a capillary and/or a tool used for wire bonding sticks and damages the semiconductor element. The semiconductor element is thinned and thus rigidity is lowered; and if the void is present just beneath the wire bonding electrode, it is also conceivable that the chip is fractured by the shock of the wire bonding. The convex portions of the convex bonding layers 3 are located on the backsides thereof; and thus, the void can be eliminated.

Embodiment 3

Figure 8:
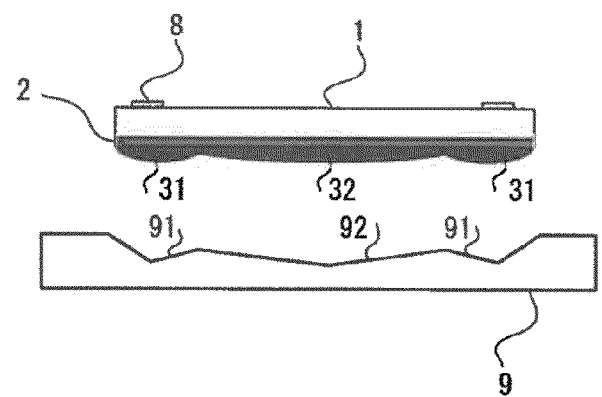
FIG. 8 is a conceptual view showing an initial process of a die bonding process according to Embodiment 3.
Figure 9:
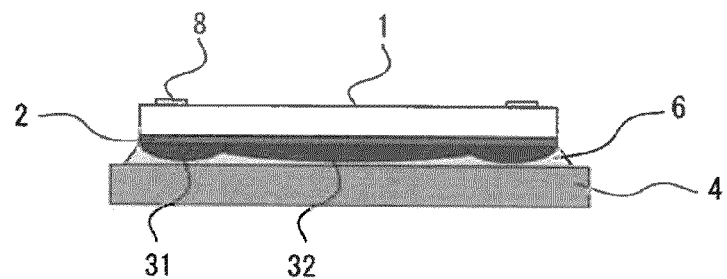
FIG. 9 is a conceptual view showing a finished product of the die bonding process according to Embodiment 3.

FIG. 8 and FIG. 9 are conceptual views each showing a die bonding process of a semiconductor element according to Embodiment 3. In Embodiment 3, as shown in FIG. 8, an aluminum jig 9 is used, the aluminum jig having opening portions in which opening portions 91 and an opening portion 92, each being shaped in a quadrangular pyramid, are linked. Solder paste of high temperature solder is filled in the opening portions 91, 92; and an Si chip 1 is mounted on the aluminum jig 9, with a metallization layer 2 facing downward. The solder paste of the high temperature solder filled in the opening portions 91, 92 is made to melt to transfer the high temperature solder on the metallization layer 2. Next, solder paste of low temperature solder is printed and supplied by using a printing mask (opening portion: 5 mm×5 mm, thickness: 0.3 mm); and the Si chip 1 is mounted on a lead frame 4, with convex bonding layers 31, 32 facing downward.

Finally, solder paste of the low temperature solder is made to melt by a hot plate heated to 240° C. to form a concave bonding layer 6 (see FIG. 9). The opening portions of the aluminum jig 9 are linked; and thus, the convex bonding layer 31 of a small convex shape and the convex bonding layer 32 of a central convex shape are linked. The metallization layer (Si chip electrode) 2 is not exposed during the formation of the concave bonding layer 6; and therefore, it is difficult to have an influence on heat dissipation properties even when a void is generated between the convex portions.

Embodiment 4

Figure 10:
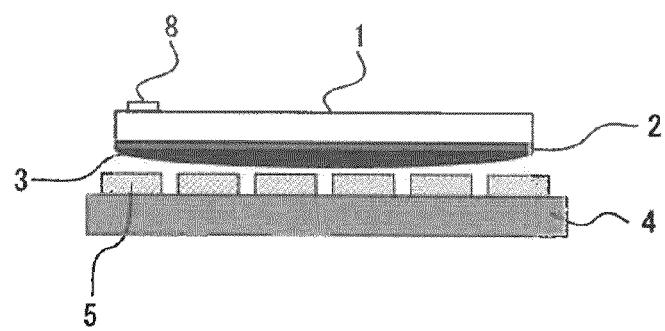
FIG. 10 is a conceptual view showing an initial process of a die bonding process according to Embodiment 4.
Figure 11:
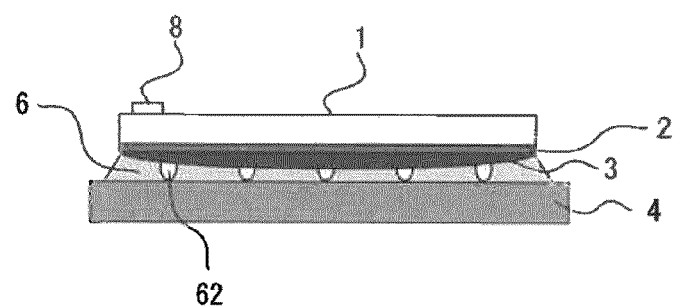
FIG. 11 is a conceptual view showing a finished product of the die bonding process according to Embodiment 4.

FIG. 10 and FIG. 11 are conceptual views each showing a die bonding process of a semiconductor element according to Embodiment 4. In Embodiment 4, as shown in FIG. 10, solder paste 5 of low temperature solder used for bonding is divided into 36 to be printed and supplied. The solder paste 5 is heated at a temperature at which the solder paste 5 maintains the original shape and the solder paste 5 is bonded to a convex bonding layer 3. A concave bonding layer 6 of the low temperature solder is formed in a divided state (see FIG. 11). Gaps 62 are remained in the concave bonding layer 6; and thus, a bonding portion which is more flexible and superior in temperature cycling property can be formed. At this time, liquid components in the solder paste of the low temperature solder are reduced and bonding material made of low melting point metal powder in which high melting point metal powder is dispersed is used; and thus, a change in shape before and after bonding can be suppressed.

Incidentally, in this case, the convex bonding layer 3 is formed on the Si chip side; however, even when an enclosure that limits a wetting range by a solder resist or the like is formed on the lead frame side and a convex of high temperature solder is formed on the lead frame side or both sides, similar effects can be obtained. Furthermore, the high temperature solder is used for forming a convex state; however, similar effects can be obtained even when the convex state is formed, for example, by using adhesive containing a metallic filler such as silver (Ag) paste and by pressing a die. A sphere is ideal for the convex of the convex bonding layer 3; however, even when a part of the apex thereof is flat, similar effects can be obtained if the height thereof is gradually reduced at near an outer edge portion.

When SiC is used for the Si chip 1, a semiconductor device 100 is operated at a higher temperature than the case of using Si in order to make use of the characteristics thereof. In a semiconductor device on which an SiC device is mounted, higher reliability is required as the semiconductor device; and therefore, the merit of the present invention which achieves a highly reliable semiconductor device becomes more effective.

Incidentally, the present invention can freely combine the respective embodiments and appropriately change or omit the respective embodiments, within the scope of the present invention.

DESCRIPTION OF REFERENCE NUMERALS

1 Si chip,
2 Metallization layer,
3 Convex bonding layer,
4 Lead frame,
5 Solder paste,
6 Concave bonding layer,
71 to 73 Void,
8 Wire bonding electrode,
9 Aluminum jig,
15 Molding resin,
31 Convex bonding layer,
32 Convex bonding layer,
62 Gap

The invention claimed is:

1. A semiconductor device comprising:
a semiconductor element in which a metallization layer is formed on a backside side;
a metallic lead frame that is arranged in parallel, with a distance spaced apart from said semiconductor element;
a first bonding layer that is provided between said semiconductor element and said lead frame, and is bonded to said metallization layer; and
a second bonding layer that is provided between said semiconductor element and said lead frame, and bonds said first bonding layer to said lead frame,
wherein said first bonding layer is increased in thickness toward said lead frame at a central portion of said first bonding layer relative to a portion of the first bonding layer other than the central portion and is higher in melting point than said second bonding layer, and
further wherein said second bonding layer is divided into a plurality of sections by air gaps and said first bonding layer is a single continuous layer.

2. The semiconductor device according to claim 1, wherein said semiconductor element is formed by a wide band gap semiconductor.

3. The semiconductor device according to claim 2, wherein said wide band gap semiconductor is any semiconductor of silicon carbide, gallium nitride-based material, and diamond.

4. The semiconductor device according to claim 1, wherein said first bonding layer contains a first metal, and said second bonding layer contains a second metal that is lower in melting point than said first metal.

5. The semiconductor device according to claim 1, wherein said second bonding layer is out of contact with said metallization layer.

* * * * *